(12) United States Patent
Shimoda et al.

(10) Patent No.: US 7,469,191 B2
(45) Date of Patent: Dec. 23, 2008

(54) JITTER MEASUREMENT METHOD, JITTER MEASURING APPARATUS AND IMAGE FORMING APPARATUS

(75) Inventors: Kyoji Shimoda, Amagasaki (JP); Koichi Saito, Tokyo (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 144 days.

(21) Appl. No.: 11/195,466

(22) Filed: Aug. 1, 2005

(65) Prior Publication Data

US 2006/0031033 A1 Feb. 9, 2006

(30) Foreign Application Priority Data

Aug. 3, 2004 (JP) ............................. 2004-227228

(51) Int. Cl.
*G01R 29/26* (2006.01)
(52) U.S. Cl. .................. 702/69; 250/235; 358/481; 347/111; 356/608
(58) Field of Classification Search .................. 702/69; 250/234, 235, 584, 237 G; 359/205, 212, 359/198–213; 347/134, 140, 111–121; 399/130, 399/140; 358/481, 475; 356/607, 608
See application file for complete search history.

(56) References Cited

U.S. PATENT DOCUMENTS 4,872,065 A * 10/1989 Isono et al. .................. 358/494
5,233,368 A * 8/1993 Yamanaka et al. .......... 347/132
5,355,154 A * 10/1994 Guerin ........................ 347/116
5,539,441 A * 7/1996 Appel et al. ................. 347/134
6,151,152 A * 11/2000 Neary ......................... 359/216
6,178,031 B1 * 1/2001 Rauch et al. ................ 359/216
6,603,588 B2 * 8/2003 Hagelin et al. .............. 359/212
6,800,844 B2 * 10/2004 Kandori et al. ............. 250/234
7,193,643 B2 * 3/2007 Zomorrodi et al. .......... 347/249
2003/0063183 A1 * 4/2003 AuYeung et al. ............ 347/246
2004/0085438 A1 * 5/2004 Zomorrodi et al. .......... 347/247

FOREIGN PATENT DOCUMENTS

| JP | 6-289305 | 10/1994 |
| JP | 10-148775 | 6/1998 |
| JP | 11-305159 | 11/1999 |
| JP | 2002-296524 | 10/2002 |
| JP | 2003-307700 | 10/2003 |
| JP | 2003-329960 | 11/2003 |

* cited by examiner

*Primary Examiner*—Tung S Lau
*Assistant Examiner*—Hien X Vo
(74) *Attorney, Agent, or Firm*—Katten Muchin Rosenman LLP

(57) ABSTRACT

The present invention measures jitter in a galvano scanner that scans a light beam on a surface to be scanned by periodically turning a reflection mirror in a reciprocating manner. Two detectors for detecting and receiving the light beam are mounted near both ends of the scan region of the light beam, a first detection signal of each of the two detectors is extracted whenever the reflection mirror is activated for one scanning, a required time for one scanning is computed from the extracted detection signals, and a variation in the required time for each scanning is measured based on the computed required time.

12 Claims, 20 Drawing Sheets

F I G. 4
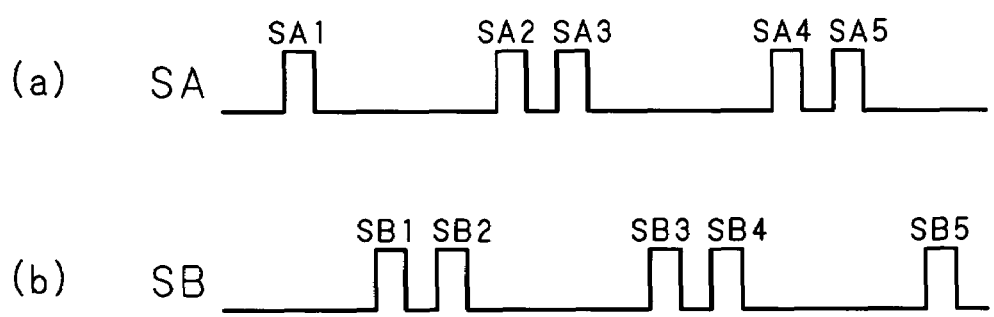

F I G. 5
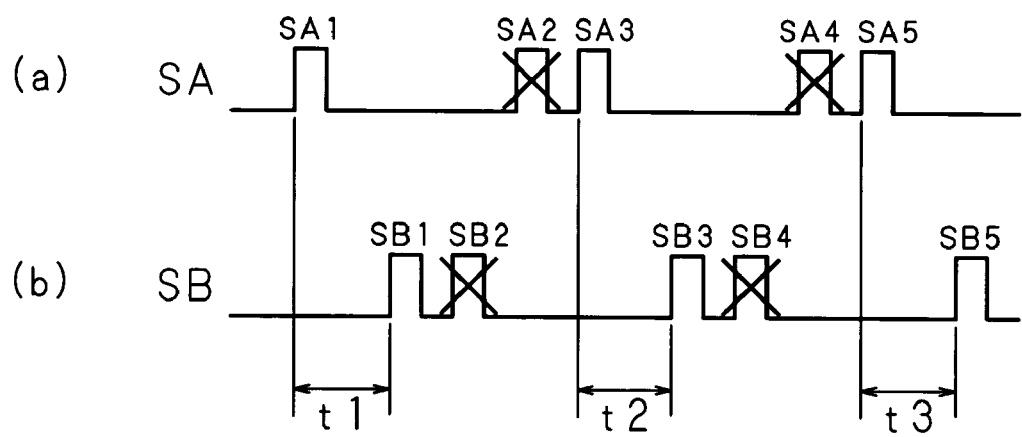

JITTER MEASUREMENT METHOD, JITTER MEASURING APPARATUS AND IMAGE FORMING APPARATUS

CROSS-REFERENCE TO RELATED APPLICATION

This non-provisional application claims priority under 35 U.S.C. §119(a) on Patent Application No. 2004-227228 filed in Japan on Aug. 3, 2004, the entire contents of which are hereby incorporated by reference.

BACKGROUND OF THE INVENTION

The present invention relates to a jitter measurement method and a jitter measuring apparatus for measuring the variation (jitter) in the time required for each scan line of a galvano scanner that scans a light beam on a surface to be scanned by periodically turning a reflection mirror in a reciprocating manner, and also relates to image forming apparatuses such as printers, copying machines and multi-function machines comprising the main components of the jitter measuring apparatus.

In a laser scanner head type laser printer, light from a laser light source is converted into parallel light by a collimator lens, and a polygon mirror is rotated to scan the parallel laser light across a print width on a photoreceptor. In such a laser printer, the variation in the scan time that is jitter when scanning a surface to be scanned occurs due to a manufacturing error in a deflecting surface of an optical deflector constituting a scanning optical system, a drive error in a driving mechanism of the optical deflector, etc. By accurately measuring the variation in the scan time, it is possible to easily find the cause of the scanning variation, and it is possible to manufacture scanning optical systems capable of accurately scanning light for laser printers, copying machines, multi-function machines, etc.

FIG. 1 is an explanatory view schematically showing a structural example for measuring the variation (jitter) in the scan time of a conventional laser printer. Detectors A and B that are optical sensors are mounted near both ends of a scan line of a light beam, and scanning is performed by reflecting the light beam from a laser diode LD by a polygon mirror 36 that rotates in one direction at a uniform speed. At this time, for example, the detectors A and B output detection signals SA1 and SB1, respectively, for a scan line of the first mirror surface, and then each time the mirror surface reflecting the light beam changes, the light beam scans a new scan, and detection signals SA3, SB3, SA5, SB5 . . . are outputted. Since the detection signals are separately outputted from the detectors A and B as shown in FIG. 2(*a*), (*b*), the scan time is time t1, t2, t3 from the detection signal of the detector A to the detection signal of the detector B, and the variation in the scan time can be found based on these times.

In recent years, there has been an advancement in the development of galvano scanner type laser printers using a micro mirror (micro swing mirror element), which is a mirror constructed in small size, for a reflection mirror instead of a polygon mirror as a light beam scanning mechanism. The micro mirror is realized by constructing a small-size mirror as a mechanical element for reflecting light by using a MEMS (Micro Electro Mechanical System) technology that realizes various kinds of small-size mechanical elements by the application of techniques in the semiconductor manufacturing processes. Since the micro mirror is reciprocally turned by an electrostatic force and changes the light reflection path in accordance with the turned angle, it is suitable as a light beam scanning mechanism, and systems for scanning a light beam using a micro mirror have been developed (see, for example, Japanese Patent Application Laid-Open No. 11-305159 (1999)).

BRIEF SUMMARY OF THE INVENTION

In a galvano scanner type laser printer, the variation (jitter) in the scan time is also caused by a manufacturing error in a mirror and a drive error in a driving mechanism. The variation in the scan time of a galvano scanner type laser printer is measured by a structure schematically shown in FIG. 3, for example. Detectors A and B that are optical sensors are mounted near both ends of a scan line of a light beam, and scanning is performed by reflecting the light beam from a laser diode LD by a micro mirror (galvano mirror) 10 that is periodically turned in a reciprocating manner. At this time, for example, the detectors A and B output detection signals SA1 and SB1, respectively, for the first scan line, and further output detection signals SA2 and SB2 when the light beam returns to the start point of scanning. Thereafter, each time scanning is performed, detection signals SA3, SB3, SA5, SB5 . . . are outputted, and each time the light beam returns to the start point of scanning, detection signals SA4, SB4 . . . are outputted.

As described above, when measuring the variation in the scan time of the galvano scanner type laser printer, the detection signals are separately outputted as shown in FIG. 4 (*a*), (*b*) from the individual detectors A and B. The scan time is the time from the detection signals SA1, SA3, SA5 . . . of the detector A to the detection signals SB1, SB3, SB5 . . . of the detector B, and the variation in the scan time can be found based on these times. However, in order to calculate the scan time, as shown in FIG. 5 (*a*), (*b*), the detection signals SA2, SB2, SA4, SB4 . . . detected when the light beam returns to the start point of scanning are unnecessary. Thus, there is a problem that it is necessary to remove these unnecessary signals and correct the detection signal sequences of the detectors A and B as shown in FIG. 6 (*a*),(*b*) to enable the calculation of the scan times t1, t2, t3.

Moreover, in the galvano scanner type laser printer, there is also a problem that in order to obtain a timing of writing an electrostatic latent image on a photoreceptor drum in scanning, it is necessary to remove the unnecessary signals and correct the detection signal sequences of the detectors A and B for the same reason as mentioned above.

The present invention has been made with the aim of solving the above problems, and it is an object of the present invention to provide a jitter measurement method and a jitter measuring apparatus capable of measuring the variation in the scan time of a galvano scanner type image forming apparatus by removing unnecessary detection signals.

Another object of the invention is to provide a galvano scanner type image forming apparatus capable of obtaining a timing of writing an electrostatic latent image on a photoreceptor drum in scanning by removing unnecessary detection signals.

A jitter measurement method and a jitter measuring apparatus according to the present invention measure jitter in a galvano scanner for scanning a light beam on a surface to be scanned by periodically turning a reflection mirror (galvano mirror) in a reciprocating manner.

In a jitter measurement method and a jitter measuring apparatus for a galvano scanner according to a first aspect of the invention, two detectors for receiving and detecting a light beam are mounted near both ends of a scan region of the light beam, a first detection signal is extracted from each of the two detectors whenever a reflection mirror is activated for one scanning, a required time for one scanning is computed from the extracted detection signals, and a variation in the required time for each scanning is measured based on the computed required time. It is therefore possible to remove unnecessary detection signals and measure the variation in the scan time of a galvano scanner type image forming apparatus.

In a jitter measurement method and a jitter measuring apparatus for a galvano scanner according to a second aspect of the invention, two detectors for receiving and detecting a light beam are mounted near both ends of a scan region of the light beam, an output signal is inverted and retained each time a detection signal of the detectors is outputted, a first detection signal since a reflection mirror was activated for one scanning is extracted based on the inverted and retained output signals and the detection signals, a required time for one scanning is computed from the extracted detection signals of the two detectors, and a variation in the required time for each scanning is measured based on the computed required time. It is therefore possible to remove unnecessary detection signals and measure the variation in the scan time of a galvano scanner type image forming apparatus.

In a jitter measurement method and a jitter measuring apparatus for a galvano scanner according to a third aspect of the invention, two detectors for receiving and detecting a light beam are mounted near a beginning end and near a final end of a scan region of the light beam, an output signal is inverted and retained each time a detection signal of the detectors is outputted, a first detection signal since a reflection mirror was activated for one scanning is extracted based on the output signals inverted and retained by the detection signal of the detector near the final end and the detection signal, the detection signals outputted by the two detectors are validated during a time other than a time until an output signal is inverted based on the detection signals of the detector near the beginning end after the detection signal was extracted, a time from the validated one detection signal to the other detection signal is computed as a required time for one scanning, and a variation in the required time for each scanning is measured based on the computed required time. It is therefore possible to remove unnecessary detection signals and measure the variation in the scan time of a galvano scanner type image forming apparatus.

In a jitter measurement method and a jitter measuring apparatus for a galvano scanner according to a fourth aspect of the invention, a detector for receiving and detecting a light beam is mounted near one end of a scan region of the light beam, a first detection signal of the detector is extracted whenever a reflection mirror is activated for one scanning, a time between two detection signals extracted one after another is computed, and a variation in the computed time is measured as a variation in a required time for each scanning. It is therefore possible to remove unnecessary detection signals and measure the variation in the scan time of a galvano scanner type image forming apparatus.

An image forming apparatus according to the present invention comprises a galvano scanner for scanning a light beam on a photoreceptor surface by periodically turning a reflection mirror in a reciprocating manner.

In an image forming apparatus according to a fifth aspect of the invention, two detectors for receiving and detecting a light beam are mounted near both ends of a scan region of the light beam, a first detection signal of each of the two detectors is extracted whenever a reflection mirror is activated for one scanning, and an electrostatic latent image is written on a photoreceptor surface based on timings of the extracted detection signals. It is therefore possible to remove unnecessary detection signals and obtain a timing of writing an electrostatic latent image on a photoreceptor drum in scanning.

In an image forming apparatus according to a sixth aspect of the invention, two detectors for receiving and detecting a light beam are mounted near both ends of a scan region of the light beam, an output signal is inverted and retained each time a detection signal of the detectors is outputted, a first detection signal since a reflection mirror was activated for one scanning is extracted based on the inverted and retained output signals and the detection signals, and an electrostatic latent image is written on a photoreceptor surface based on timings of the extracted detection signals. It is therefore possible to remove unnecessary detection signals and obtain a timing of writing an electrostatic latent image on a photoreceptor drum in scanning.

In an image forming apparatus according to a seventh aspect of the invention, two detectors for receiving and detecting a light beam are mounted near a beginning end and near a final end of a scan region of the light beam, an output signal is inverted and retained each time a detection signal of the detectors is outputted, a first detection signal since a reflection mirror was activated for one scanning is extracted based on the output signals inverted and retained based on the detection signal of the detector near the final end and the detection signal, the detection signals outputted by the two detectors are validated during a time other than a time until an output signal is inverted based on the detection signal of the detector near the beginning end after extracting the detection signal, and an electrostatic latent image is written on a photoreceptor surface based on timings of the validated two detection signals. It is therefore possible to remove unnecessary detection signals and obtain a timing of writing an electrostatic latent image on a photoreceptor drum in scanning.

In an image forming apparatus according to an eighth aspect of the invention, a detector for receiving and detecting a light beam is mounted near one end of a scan of the light beam, a first detection signal of the detector since a reflection mirror was activated for one scanning is extracted, and an electrostatic latent image is written on a photoreceptor surface based on a timing of the extracted detection signal. It is therefore possible to remove unnecessary detection signals and obtain a timing of writing an electrostatic latent image on a photoreceptor drum in scanning.

The above and further objects and features of the invention will more fully be apparent from the following detailed description with accompanying drawings.

BRIEF DESCRIPTION OF THE SEVERAL VIEWS OF THE DRAWINGS

FIG. 4 is a waveform chart showing detection signals of detectors shown in FIG. 3;

FIG. 5 is a waveform chart showing unnecessary detection signals of the detectors shown in FIG. 3;

DETAILED DESCRIPTION OF THE INVENTION

The following description will explain in detail the present invention, based on the drawings illustrating some embodiments thereof.

Embodiment 1

Figure 7:
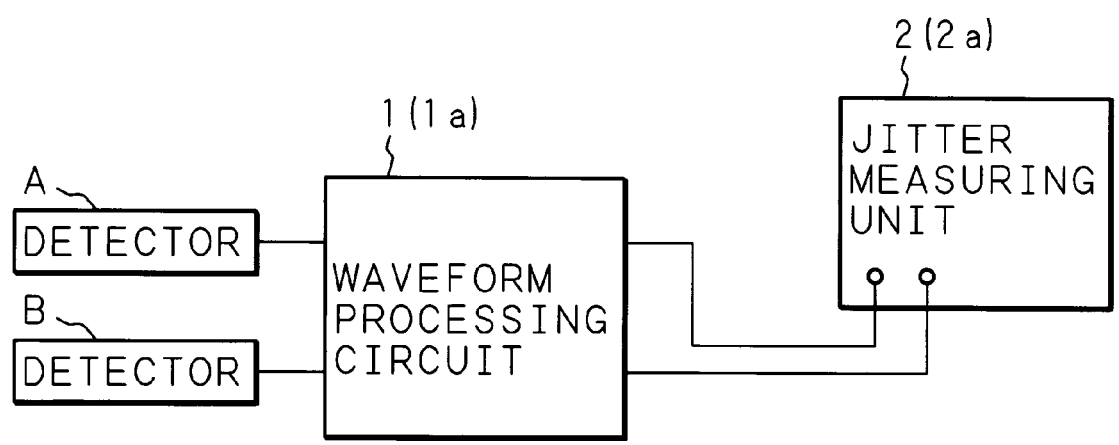
FIG. 7 is a block diagram showing a structure of an embodiment of a jitter measurement method and a jitter measuring apparatus of the present invention.

FIG. 7 is a block diagram showing the structure of Embodiment 1 of a jitter measurement method and a jitter measuring apparatus of the present invention. In this jitter measuring apparatus, detection signals of detectors A and B are separately supplied to a waveform processing circuit 1. The waveform processing circuit 1 removes unnecessary signals from the detection signal sequences of the detectors A and B, and supplies the resulting detection signal sequences of the respective detectors A and B separately to a jitter measuring unit 2. The jitter measuring unit 2 computes a scan time of each scanning from the supplied detection signal sequences of the detectors A and B, and measures (calculates) the variation in the scan time based on the computed scan times.

Figure 8:
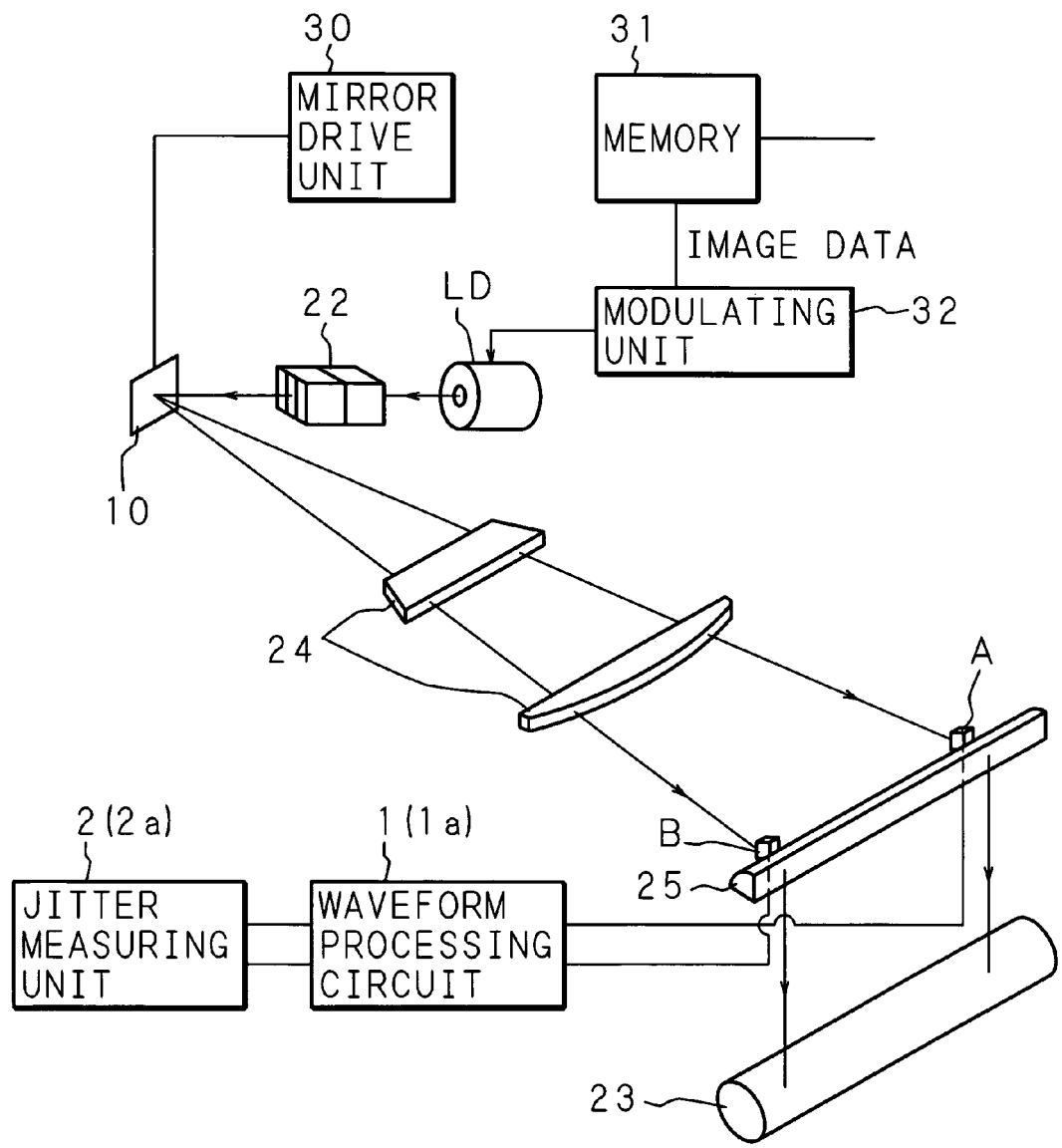
FIG. 8 is an explanatory view schematically showing a structural example of a scanning optical system of the jitter measuring apparatus of the present invention.

FIG. 8 is an explanatory view schematically showing a structural example of a scanning optical system of the jitter measuring apparatus of the present invention. In this scanning optical system, a laser diode LD for emitting laser light and a collimator lens 22 for converting the laser light from the laser diode LD into parallel light are arranged on the light incident side of a micro mirror 10. On the light reflecting side of the micro mirror 10, a f-θ lens 24 for focusing the laser light onto a photoreceptor 23 and a cylindrical mirror 25 are mounted. The parallel laser light converted by the collimator lens 22 strikes the micro mirror 10, and the micro mirror 10 is periodically turned in a reciprocating manner to scan the parallel laser light across a print width.

A mirror drive unit 30 turns the micro mirror 10 reciprocally in a resonant state by applying an AC voltage of natural frequency of the micro mirror 10 to the micro mirror 10. Image data from an external device such as a personal computer, or image data obtained by reading, are stored in a memory 31 once, and then supplied to a modulating unit 32 according to the scan timing of the parallel laser light. The modulating unit 32 modulates the laser light emitted by the laser diode LD in accordance with the supplied image data. However, the memory 31 and the modulating unit 32 are not necessarily connected when measuring jitter. The detectors A and B shown in FIG. 7 are mounted at positions corresponding to the vicinity of both ends of a scan line on a light receiving surface of the cylindrical mirror 25, and the waveform processing circuit 1 and the jitter measuring apparatus 2 are connected in accordance with the structure shown in FIG. 7.

Figure 1:
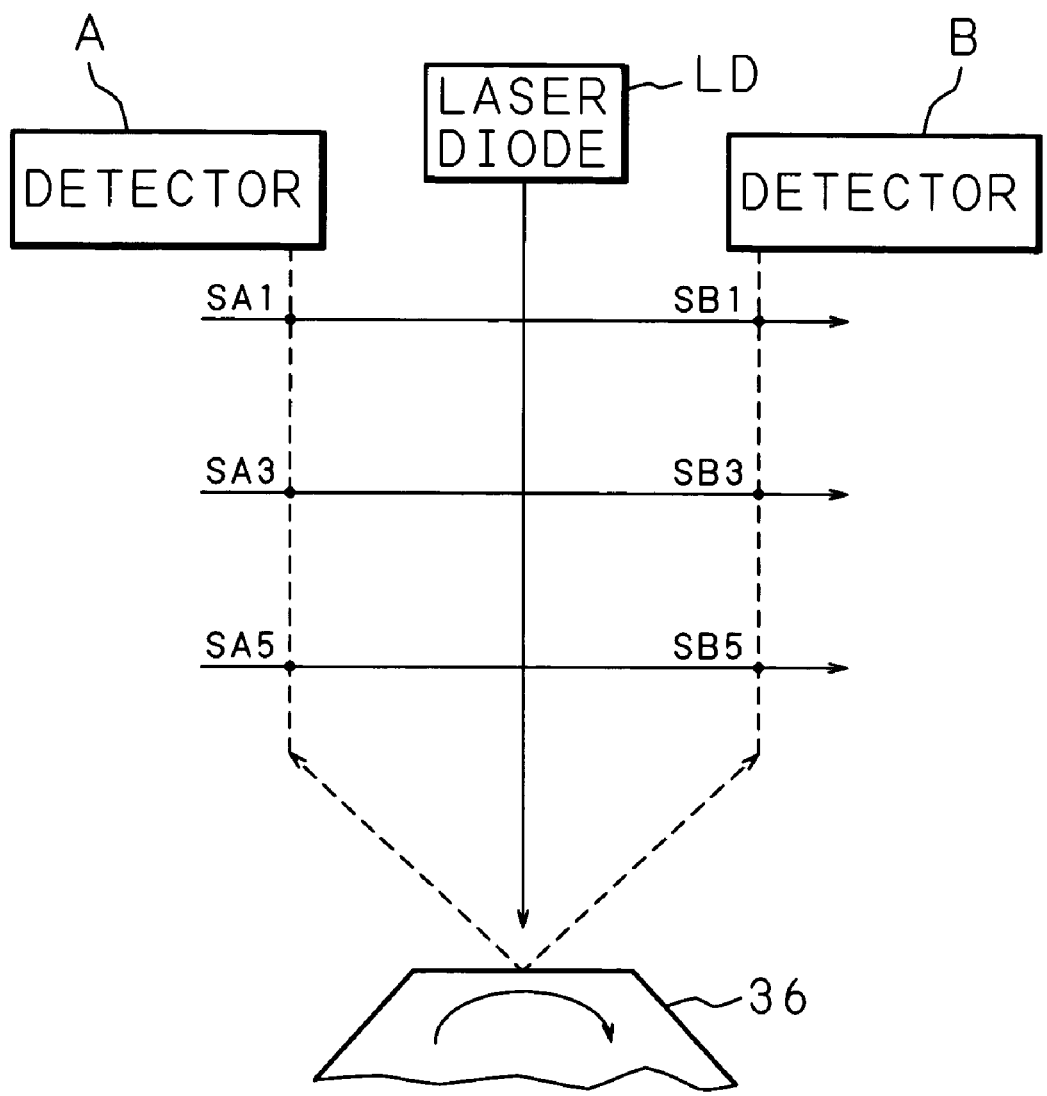
FIG. 1 is an explanatory view schematically showing a structural example for measuring jitter in a conventional laser printer using a polygon mirror.
Figure 2:
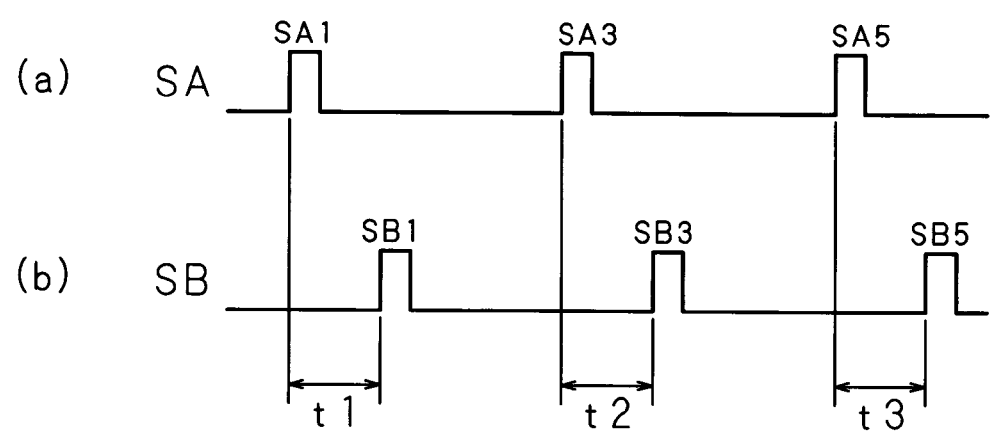
FIG. 2 is a waveform chart showing detection signals of detectors shown in FIG. 1.
Figure 3:
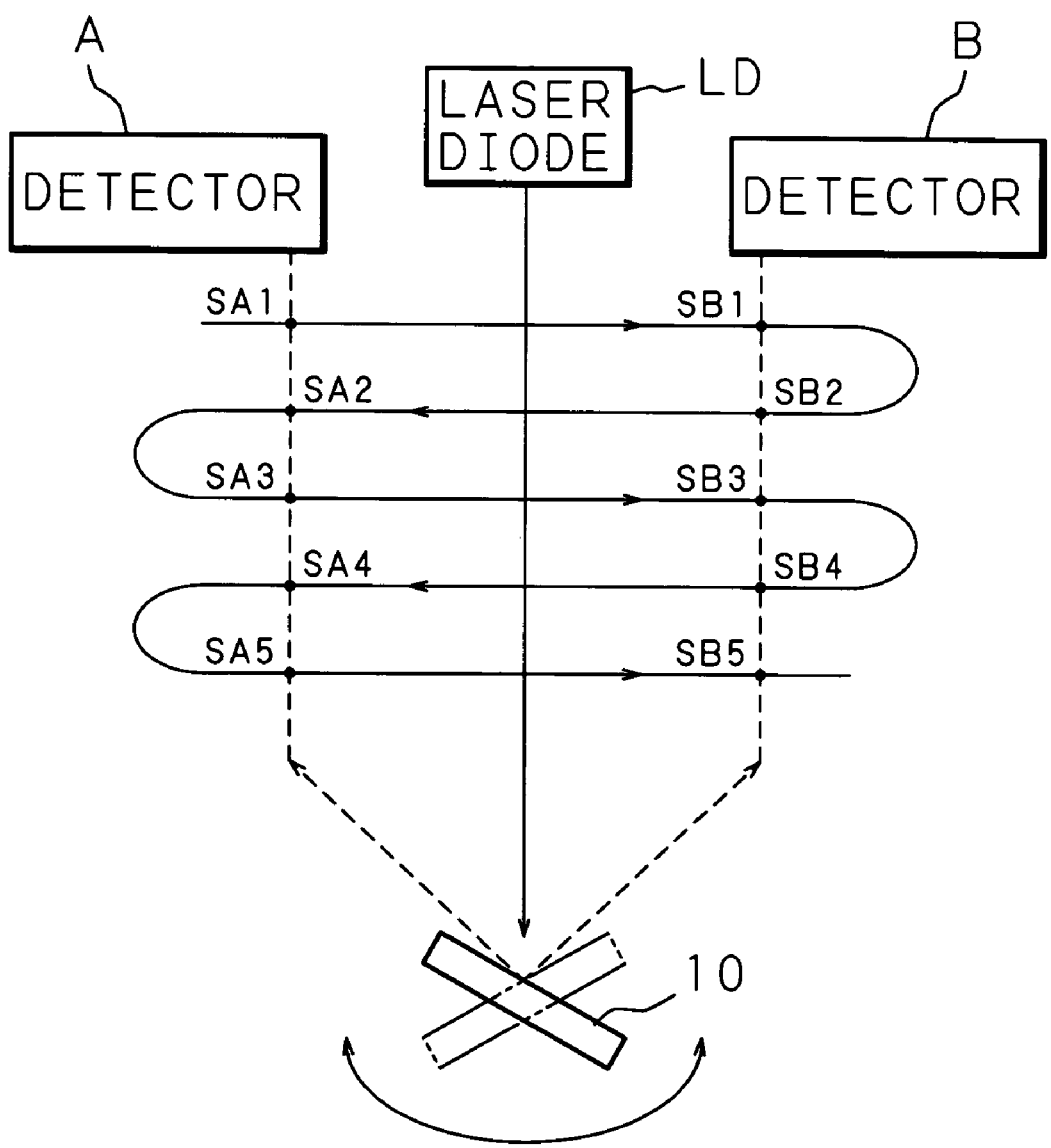
FIG. 3 is an explanatory view schematically showing a structural example for measuring jitter in a galvano scanner type laser printer using a polygon mirror.
Figure 6:
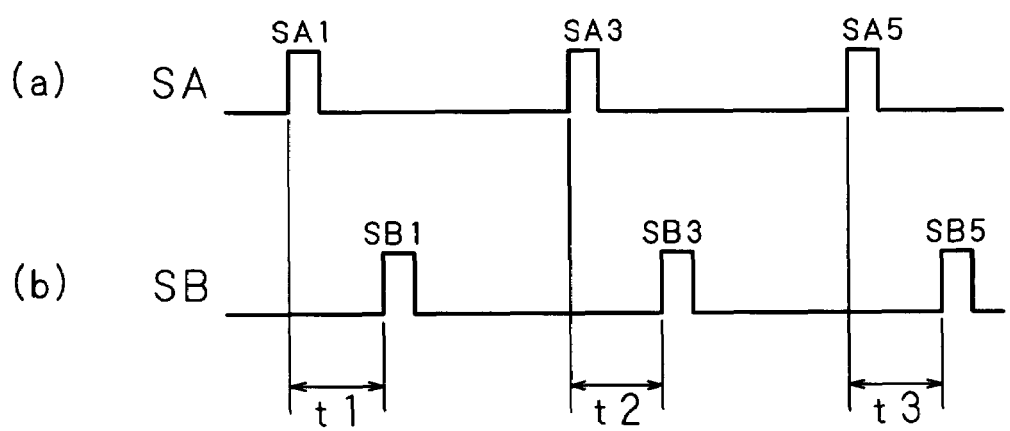
FIG. 6 is a waveform chart showing modified examples of detection signals of the detectors shown in FIG. 3.

FIG. 3 is an explanatory view schematically showing a structural example for implementing a jitter measurement method of the present invention. In this jitter measurement method, as shown in FIG. 8, the detectors A and B that are optical sensors are mounted near both ends of a scan line of a light beam, and scanning is performed by reflecting the light beam from the laser diode LD by the micro mirror (galvano mirror) 10 that is periodically turned in a reciprocating manner. At this time, for example, the detectors A and B output detection signals SA1 and SB1, respectively, for the first scan line, and further output detection signals SA2 and SB2 when the light beam returns to the start point of scanning. Thereafter, each time scanning is performed, detection signals SA3, SB3, SA5, SB5 ... are outputted, and each time the light beam returns to the start point of scanning, detection signals SA4, SB4 ... are outputted. The detection signals SA and SB of the detectors A and B are outputted as shown in FIG. 4 (a), (b) as described above.

Figure 9:
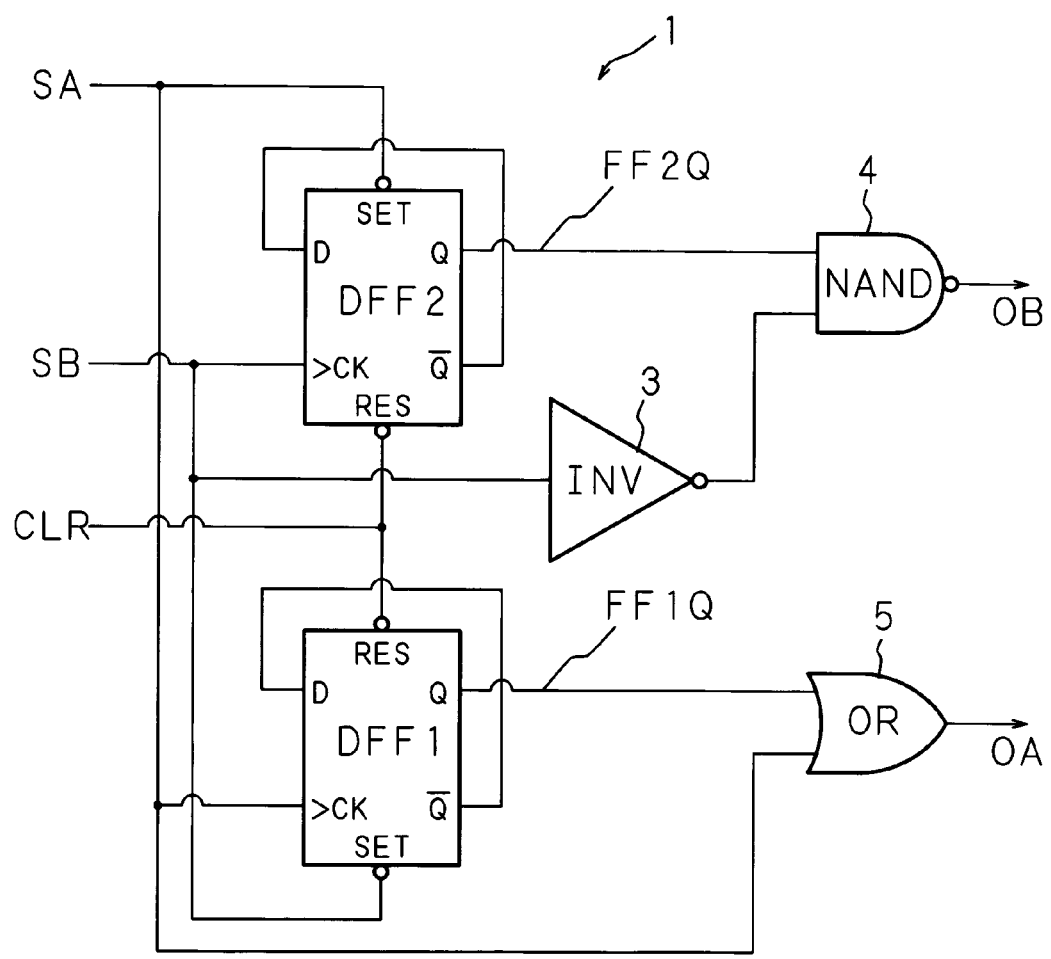
FIG. 9 is a block diagram showing a structural example of a waveform processing circuit.

FIG. 9 is a block diagram showing a structural example of the waveform processing circuit 1 (FIGS. 7 and 8). In this waveform processing circuit 1, the detection signal SA of the detector A is supplied to a set terminal SET of a D (delay) type flip-flop DFF2 and a clock terminal CK of a D type flip-flop DFF1, and also supplied to one input terminal of an OR gate 5. An output signal FF1Q from an output terminal Q of the D type flip-flop DFF1 is supplied to the other input terminal of the OR gate 5, and an output signal OA of the OR gate 5 is supplied to the jitter measuring unit 2 (FIGS. 7 and 8).

The detection signal SB of the detector B is supplied to a clock terminal CK of the D type flip-flop DFF2 and a set terminal SET of the D type flip-flop DFF1, and also supplied to one input terminal of a NAND gate 4 through an inverter 3. An output signal FF2Q from an output terminal Q of the D type flip-flop DFF2 is supplied to the other input terminal of the NAND gate 4, and an output signal OB of the NAND gate 4 is supplied to the jitter measuring unit 2 (FIGS. 7 and 8).

The D type flip-flops DFF1 and DFF2 are activated when the input signal goes to H level from L level. Further, an inverted output terminal bar Q and a data terminal D are connected, and the D type flip-flops DFF1 and DFF2 are activated as T (toggling) type flip-flops whose output signal from the output terminal Q is inverted each time the input signal to the clock terminal CK rises. When starting a measurement, a clear signal CLR that goes to H level from L level is supplied to the reset terminals RES of the respective D type flip-flops DFF1 and DFF2.

Figure 10:
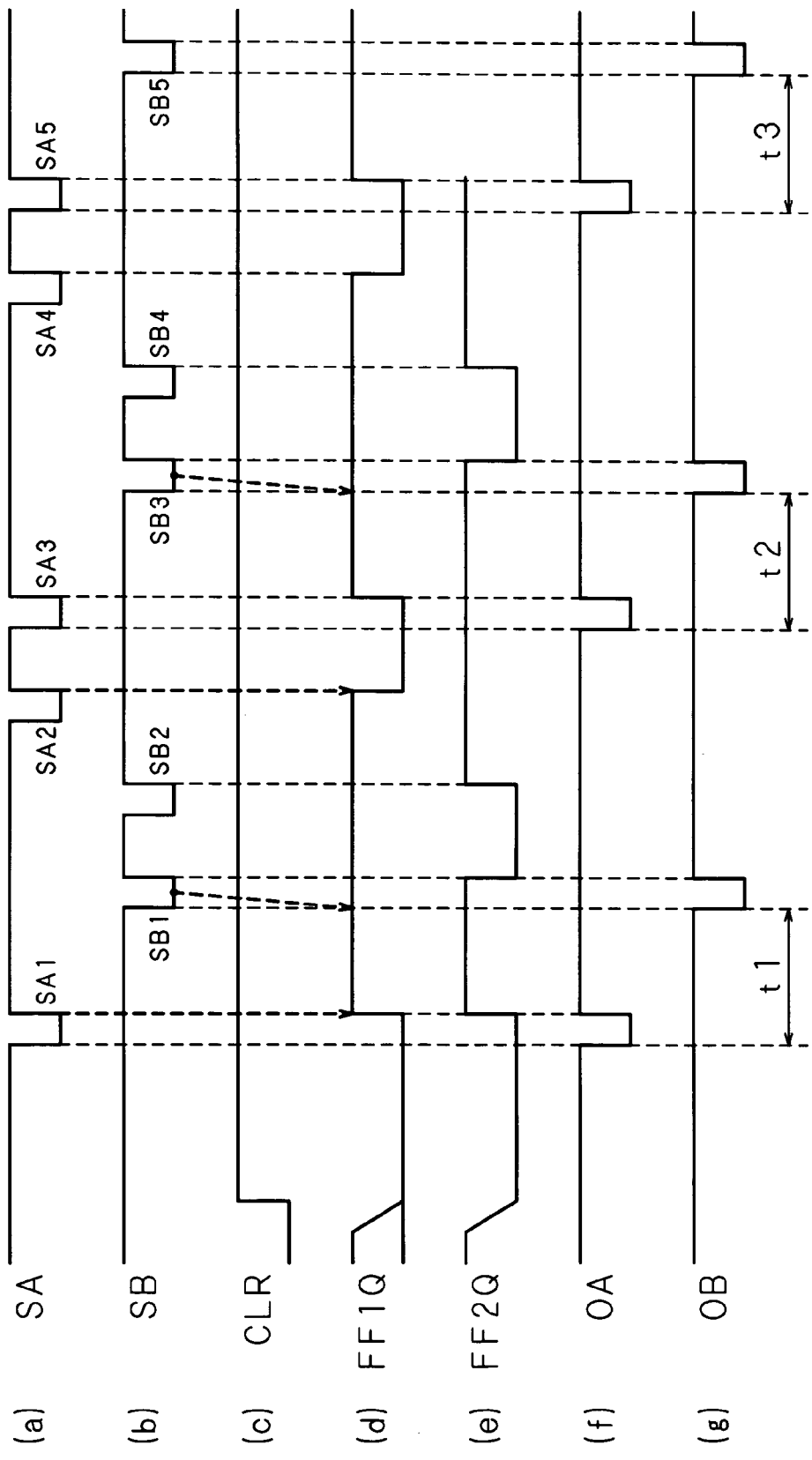
FIG. 10 is a timing chart showing the operation of the waveform processing circuit.

Referring to the timing chart shown in FIG. 10, the following description will explain the operation of the waveform processing circuit 1 having such a structure. Here, the detection signals SA and SB are inverted for the sake of the circuit. When starting a measurement, a clear signal CLR is supplied to the reset terminals RES of the respective D type flip-flops DFF1 and DFF2 (c), and the output signals FF1Q and FF2Q from the output terminals Q of the respective D type flip-flops DFF1 and DFF2 are reset to L level (d), (e).

When the detection signal SA1 is supplied from the detector A at the first scanning (a), the output signal FF1Q is L level (d), and therefore the detection signal SA1 is outputted as a signal OA from the OR gate 5 (f). When the detection signal SA1 rises, the output signals FF1Q and FF2Q from the output terminals Q of the respective D type flip-flops DFF1 and DFF2 go H level (d), (e).

When the first scanning was finished and the detection signal SB1 is supplied from the detector B (b), the detection signal SB1 is outputted as an output signal OB from the NAND gate 4 (g) because the output signal FF2Q is H level at this time (e). Then, when the detection signal SB1 rises, the output signal FF2Q from the output terminal Q of the D type flip-flop DFF2 goes to L level (e).

When the first scanning was finished and the parallel laser light returns to the start point of scanning, if the detection signal SB2 is supplied from the detector B (b), the detection signal SB1 is not outputted as an output signal OB from the NAND gate 4 (g) because the output signal FF2Q is L level at this time (e). Then, when the detection signal SB2 rises, the output signal FF2Q goes to H level (e).

When the first scanning was finished and the parallel laser light returns to the start point of scanning, if the detection signal SA2 is supplied from the detector A (a), the detection signal SA1 is not outputted as an output signal OA from the OR gate 5 (f) because the output signal FF1Q is H level at this time (d). Then, when the detection signal SA2 rises, the output signal FF1Q goes to L level (d).

When the detection signal SA3 is supplied from the detector A (a) at the second scanning, the detection signal SA3 is outputted as an output signal OA from the OR gate 5 (f) because the output signal FF1Q is L level at this time (d). When the detection signal SA3 rises, the output signal FF1Q goes to H level (d).

When the second scanning was finished and the detection signal SB3 is supplied from the detector B (b), the detection signal SB3 is outputted as an output signal OB from the NAND gate 4 (g) because the output signal FF2Q is H level at this time (e). Then, when the detection signal SB3 rises, the output signal FF2Q goes to L level (e).

When the second scanning was finished and the parallel laser light returns to the start point of scanning, if the detection signal SB4 is supplied from the detector B (b), the detection signal SB4 is not outputted as an output signal OB from the NAND gate 4 (g) because the output signal FF2Q is L level at this time (e). Then, when the detection signal SB2 rises, the output signal FF2Q goes to H level (e).

When the second scanning was finished and the parallel laser light returns to the start point of scanning, if the detection signal SA4 is supplied from the detector A (a), the detection signal SA4 is not outputted as an output signal OA from the OR gate 5 (f) because the output signal FF1Q is H level at this time (d). Then, when the detection signal SA4 rises, the output signal FF1Q goes to L level (d).

When the detection signal SA5 is supplied from the detector A (a) at the third scanning, the detection signal SA5 is outputted as an output signal OA from the OR gate 5 (f) because the output signal FF1Q is L level at this time (d). Then, when the detection signal SA5 rises, the output signal FF1Q goes to H level (d).

When the third scanning was finished and the detection signal SB5 is supplied from the detector B (b), the detection signal SB5 is outputted as an output signal OB from the NAND gate 4 (g) because the output signal FF2Q is H level at this time (e). Then, when the detection signal SB3 rises, the output signal FF2Q goes to L level (e). Similarly, the first detection signals from the detectors A and B are extracted for each scanning, and supplied as the output signals OA, OB (f), (g) to the jitter measuring unit 2 (FIGS. 7 and 8).

The jitter measuring unit 2 computes the time between the falling edges of the supplied detection signals OA (f) and OB (g) as the scan time t1, t2, t3 . . . , and measures and records the variation (jitter) in the computed scan time. When the variation in the scan time exceeds a predetermined value, a signal for indicating that the variation in the scan time is large is outputted to a display device (not shown). Note that internal jitter due to the operations occurs in the D type flip-flops DFF1 and DFF2, but since the falling edges of the output signals OA, OB (f), (g) do not include the internal jitter of the D type flip-flops DFF1 and DFF2, jitter does not become worse even through this waveform processing circuit 1.

Figure 11:
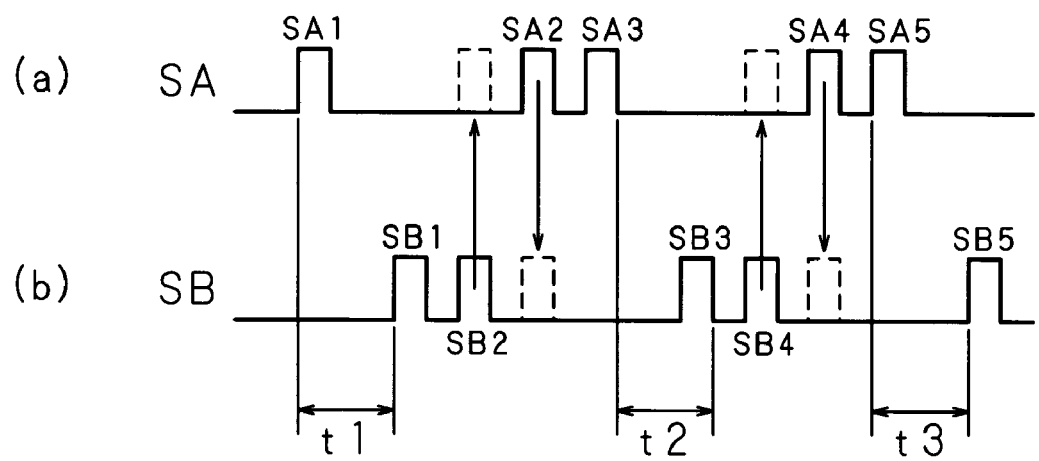
FIG. 11 is a waveform chart showing detection signals of the detectors.
Figure 12:
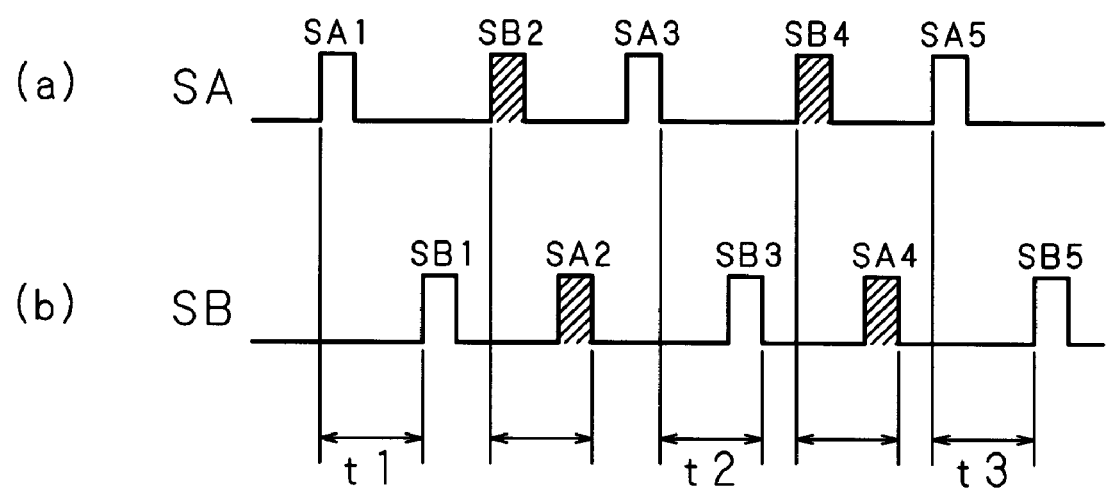
FIG. 12 is an explanatory view showing the operation of the waveform processing circuit.

Further, it is also necessary to measure jitter in the reciprocation of the scanning optical system for scanning light (parallel laser light) in the fundamental reciprocal turning of the galvano mirror, but, in a conventional measuring apparatus, it is impossible to directly measure the jitter from the detection signals shown in FIG. 11. In order to measure the jitter in the reciprocation, if "the detection signal SB2 and the detection signal SA2" and "the detection signal SB4 and the detection signal SA4" are replaced as shown in FIG. 12, it is possible to measure the jitter in the reciprocation by a conventional jitter measuring apparatus using a polygon mirror. As shown in FIG. 7, by interposing a waveform processing circuit between the detectors A, B and the conventional jitter measuring unit using a polygon mirror, a jitter measuring apparatus for a galvano scanner can be constructed using the existing measuring unit.

Embodiment 2

Figure 13:
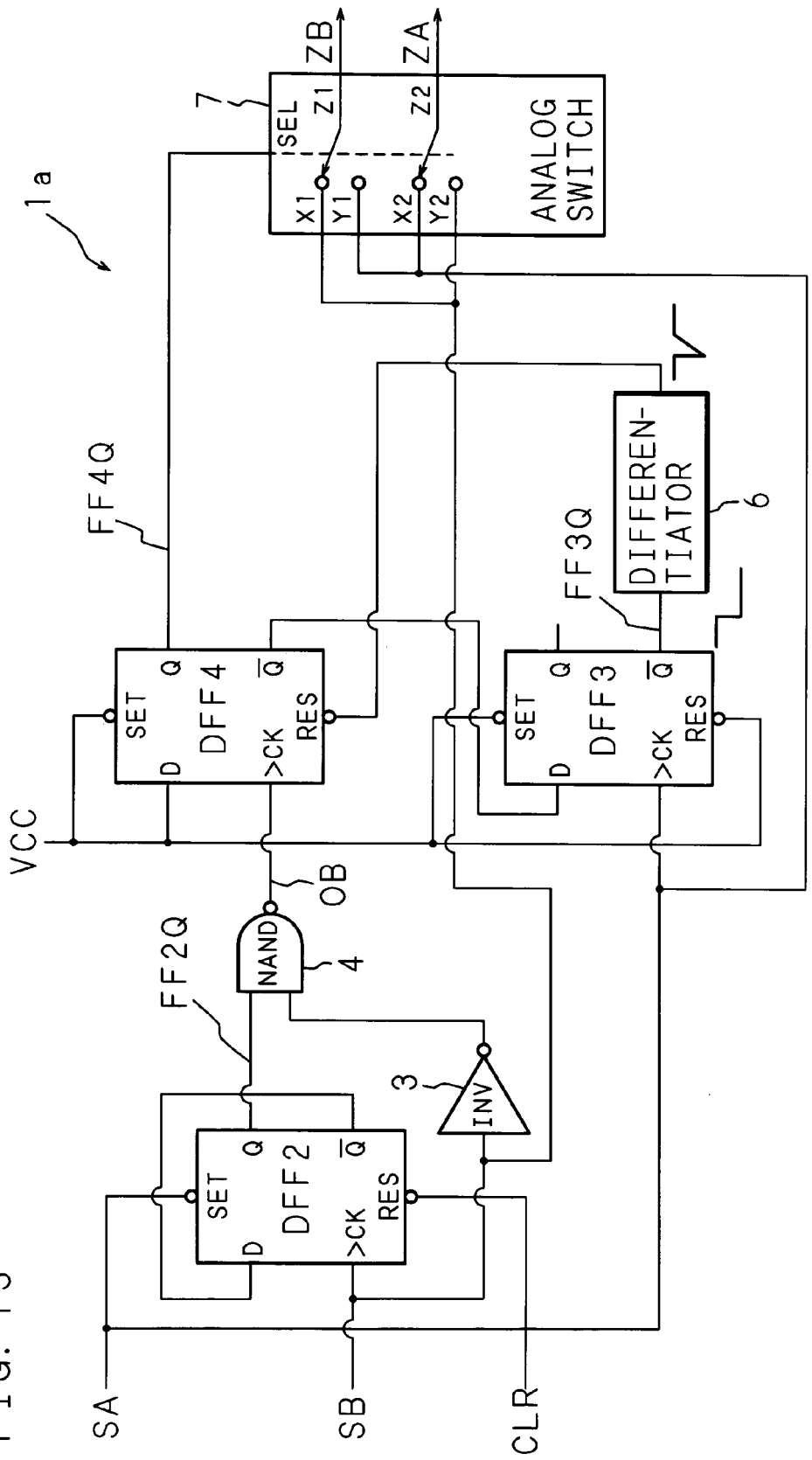
FIG. 13 is a block diagram showing a structural example of the waveform processing circuit.

FIG. 13 is a block diagram showing a structural example of a waveform processing circuit of Embodiment 2 of a jitter measurement method and a jitter measuring apparatus of the present invention. In this waveform processing circuit 1a, the detection signal SA of the detector A is supplied to the set terminal SET of the D type flip-flop DFF2 and the clock terminal CK of a D type flip-flop DFF3, and also supplied to terminals X2 and Y1 of an analog switch 7.

The detection signal SB of the detector B is supplied to the clock terminal CK of the D type flip-flop DFF2 and terminals X1 and Y2 of the analog switch 7, and also supplied to one input terminal of the NAND gate 4 through the inverter 3. An output signal FF2Q from the output terminal Q of the D type flip-flop DFF2 is supplied to the other input terminal of the NAND gate 4, and an output signal OB of the NAND gate 4 is supplied to the clock terminal CK of a D type flip-flop DFF4.

The D type flip-flops DFF2, DFF3 and DFF4 are activated when the input signal goes to H level from L level. Further, in the D type flip-flop DFF2, the inverted output terminal bar Q and the data terminal D are connected, and the D type flip-flop DFF2 is activated as a T type flip-flop whose output signal from the output terminal Q is inverted each time the input signal to the clock terminal CK rises. When starting a measurement, a clear signal CLR that goes to H level from L level is supplied to the reset terminal RES of the D type flip-flop DFF2.

A power supply voltage VCC (H level) is applied to the set terminal SET and data terminal D of the D type flip-flop DFF4 and to the set terminal SET and reset terminal RES of the D type flip-flop DFF3. The inverted output terminal bar Q of the D type flip-flop DFF4 and the data output terminal D of the D type flip-flop DFF3 are connected, and an output signal FF3Q of the inverted output terminal bar Q of the D type flip-flop DFF3 is supplied to a differentiator 6. An output of the differentiator 6 is supplied to the reset terminal RES of the D type flip-flop DFF4.

An output signal FF4Q of the output terminal Q of the D type flip-flop DFF4 is supplied to a control terminal SEL of the analog switch 7. When the input signal to the control terminal SEL is L level, the analog switch 7 connects the terminal X1 to a terminal Z1 for outputting an output signal ZB, whereas when the input signal is H level, the analog switch 7 connects the terminal Y1 to the terminal Z1. Moreover, when the input signal to the control terminal SEL is L level, the analog switch 7 connects the terminal X2 to a terminal Z2 for outputting an output signal ZA, whereas when the input signal is H level, the analog switch 7 connects the terminal Y2 to the terminal Z2. Here, a setting is made such that only the connection when the input signal to the control terminal SEL is L level becomes valid.

Figure 14:
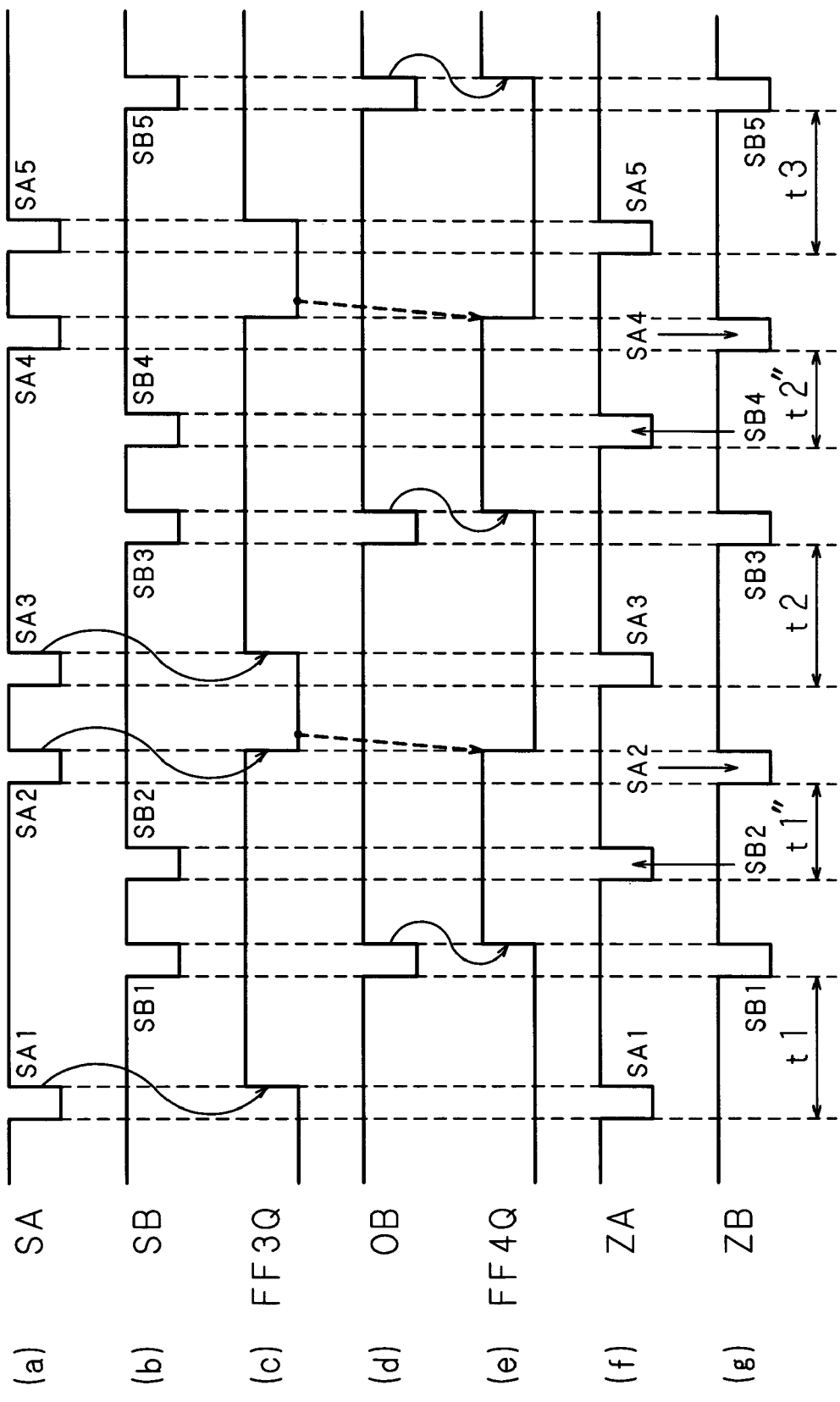
FIG. 14 is a timing chart showing the operation of the waveform processing circuit.

Since other structures of Embodiment 2 of a jitter measurement method and a jitter measuring apparatus of the present invention are the same as the above-described structures (FIGS. 7, 8 and 3) of Embodiment 1, the explanation thereof will be omitted by illustrating a jitter measuring unit 2a and the waveform processing circuit 1a in FIGS. 7 and 8. Referring to the timing chart shown in FIG. 14, the following description will explain the operation of the waveform processing circuit 1a having such a structure. Here, the detection signals SA and SB are inverted for the sake of the circuit.

When starting a measurement, a clear signal CLR is supplied to the reset terminal RES of the D type flip-flop DFF2, and an output signal FF2Q from the output terminal Q of the D type flip-flop DFF2 is reset to L level. The output signals FF3Q and FF4Q from the output terminals Q of the D type flip-flops DFF3 and DFF4 are L level according to the input level of the respective input terminals SET, D, CK and RES.

When the detection signal SA1 is supplied from the detector A at the first scanning (a), the output signal FF4Q is L level (e), and therefore the analog switch 7 connects the terminal X2 to the terminal Z2, and the detection signal SA1 is outputted as a signal ZA (f). Then, when the detection signal SA1 rises, the output signal FF3Q from the output terminal Q of the D type flip-flop DFF3 goes to H level (c), and the output signal FF2Q from the output terminal Q of the D type flip-flop DFF2 goes to H level.

When the first scanning was finished and the detection signal SB1 is supplied from the detector B (b), the detection signal SB1 is outputted as an output signal OB from the NAND gate 4 (d) because the output signal FF2Q is H level. Besides, since the output signal FF4Q is L level (e), the analog switch 7 connects the terminal X1 to the terminal Z1, and therefore the detection signal SB1 is outputted as a signal ZB (g). When the detection signal SB1 rises, the output signal FF4Q goes to H level (e).

When the first scanning was finished and the parallel laser light returns to the start point of scanning, if the detection signal SB2 is supplied from the detector B (b), the detection signal SB2 is not outputted as an output signal OB from the NAND gate 4 (d) because the output signal FF2Q is L level at this time. Moreover, since the output signal FF4Q is H level (e), the detection signal SB2 is not outputted as a signal ZB from the analog switch 7 (g). Note that in (f) and (g) in the timing chart of FIG. 14, signals SB2, SA2, SB4 and SA4 indicated with arrows are virtual signals and will be described later.

When the first scanning was finished and the parallel laser light returns to the start point of scanning, if the detection signal SA2 is supplied from the detector A (a), the detection signal SA2 is not outputted as a signal ZA from the analog switch 7 (f) because the output signal FF4Q is H level at this time (e). Then, when the detection signal SA2 rises, the output signal FF3Q goes to L level (c), and the output signal FF4Q goes to L level (e) according to a differential signal of the differentiator 6.

When the detection signal SA3 is supplied from the detector A at the second scanning (a), the output signal FF4Q is L level (e), and therefore the analog switch 7 connects the terminal X2 to the terminal Z2, and the detection signal SA3 is outputted as a signal ZA (f). Then, when the detection signal SA3 rises, the output signal FF3Q goes to H level (c), and the output signal FF2Q goes to H level.

When the second scanning was finished and the detection signal SB3 is supplied from the detector B (b), the detection signal SB3 is outputted as an output signal OB from the NAND gate 4 (d) because the output signal FF2Q is H level. Besides, since the output signal FF4Q is L level (e), the analog switch 7 connects the terminal X1 to the terminal Z1, and therefore the detection signal SB3 is outputted as a signal ZB (g). When the output signal OB rises, the output signal FF4Q goes to H level (e), and the output signal FF2Q goes to L level.

When the second scanning was finished and the parallel laser light returns to the start point of scanning, if the detection signal SB4 is supplied from the detector B (b), the detection signal SB4 is not outputted as an output signal OB from the NAND gate 4 (d) because the output signal FF2Q is L level at this time. Moreover, since the output signal FF4Q is H level (e), the detection signal SB4 is not outputted as a signal ZB from the analog switch 7 (g).

When the second scanning was finished and the parallel laser light returns to the start point of scanning, if the detection signal SA4 is supplied from the detector A (a), the detection signal SA4 is not outputted as a signal ZA from the analog switch 7 (f) because the output signal FF4Q is H level at this time (e). Then, when the detection signal SA4 rises, the inverted output signal FF3Q goes to L level (c), and the output signal FF4Q goes to L level (e) according to a differential signal of the differentiator 6.

When the detection signal SA5 is supplied from the detector A at the third scanning (a), the output signal FF4Q is L level (e), and therefore the analog switch 7 connects the terminal X2 to the terminal Z2, and the detection signal SA5 is outputted as an output signal ZA (f). Then, when the detection signal SA5 rises, the output signal FF3Q goes to H level (c), and the output signal FF2Q goes to H level.

When the third scanning was finished and the detection signal SB5 is supplied from the detector B (b), the detection signal SB5 is outputted as an output signal OB from the NAND gate 4 (d) because the output signal FF2Q is H level. Moreover, since the output signal FF4Q is L level (e), the analog switch 7 connects the terminal X1 to the terminal Z1, and the detection signal SB5 is outputted as a signal ZB (g). When the output signal OB rises, the output signal FF4Q goes to H level (e), and the output signal FF2Q goes to L level. Thereafter, similarly, when the output signal FF4Q is L level, the detection signals from the detectors A and B are extracted as signals ZA and ZB (f), (g), and the first detection signals from each of the detectors A and B are supplied as the signals ZA (f) and ZB (g), respectively, to the jitter measuring unit 2a (FIGS. 7 and 8) for each scanning.

The jitter measuring unit 2*a* computes the time between the falling edges of the supplied detection signals ZA (f) and ZB (g) as the scan time t1, t2, t3 . . . , and measures and records the variation (jitter) in the computed scan time. When the variation in the scan time exceeds a predetermined value, a signal for indicating that the variation in the scan time is large is outputted to a display device (not shown).

Note that in Embodiment 2, the analog switch 7 is set so that only the connection when the input signal to the control terminal SEL is L level becomes valid, but it may also be possible to set the analog switch 7 so that only the connection when the input signal to the control terminal SEL is H level becomes valid. In this case, in (f) and (g) in the timing chart of FIG. 14, only the signals SB2, SA2, SB4 and SA4 indicated with arrows are supplied as the signals ZA and ZB to the jitter measuring unit 2*a* (FIGS. 7 and 8).

The jitter measuring unit 2*a* computes the time between the falling edges of the supplied output signals ZA (f) and ZB (g) as time t1", t2" . . . in which the parallel laser light returns to the start point of scanning, and measures the variation (jitter) in the computed time. Note that since the analog switch 7 can switch the input signal as it is, the jitter amount does not become worse in the analog switch 7.

Embodiment 3

Figure 15:
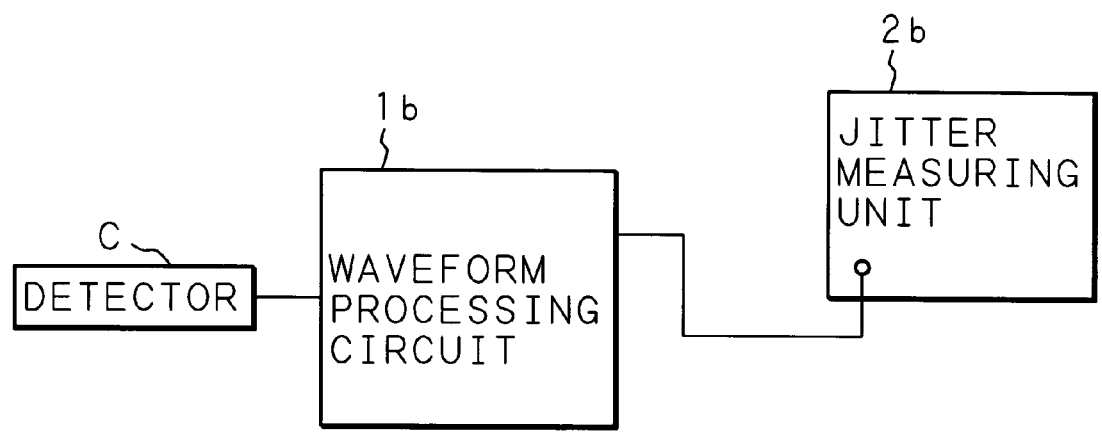
FIG. 15 is a block diagram showing a structure of an embodiment of a jitter measurement method and a jitter measuring apparatus of the present invention.

FIG. 15 is a block diagram showing the structures of Embodiment 3 of a jitter measurement method and a jitter measuring apparatus of the present invention. In this jitter measuring apparatus, a detection signal of a detector C is supplied to a waveform processing circuit 1*b*. The waveform processing circuit 1*b* removes unnecessary detection signals from a detection signal sequence of the detector C, and supplies the resulting detection signal sequence to a jitter measuring unit 2*b*. The jitter measuring unit 2*b* computes the elapsed time of each scanning from the supplied detection signal sequence, and measures (calculates) the variation in the scan time based on the computed elapsed times.

A structural example of the scanning optical system of this jitter measuring apparatus is implemented by removing the detector B from the scanning optical system shown in FIG. 8 and replacing the detector A, waveform processing circuit 1 and jitter measuring unit 2 with the detector C, waveform processing circuit 1*b* and jitter measuring unit 2*b*, respectively.

Figure 16:
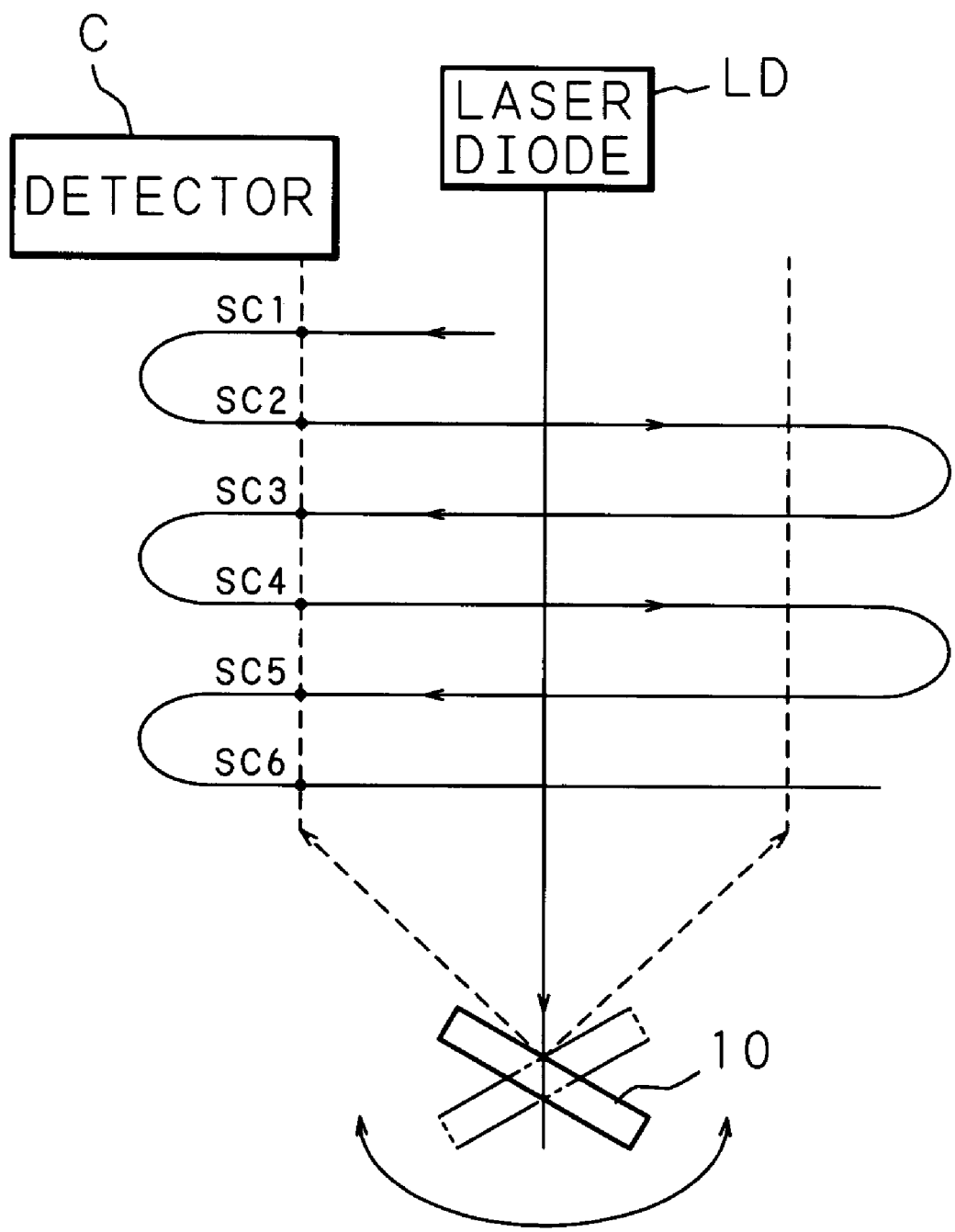
FIG. 16 is an explanatory view schematically showing a structural example for implementing the jitter measurement method of the present invention.

FIG. 16 is an explanatory view schematically showing a structural example for implementing the jitter measurement method of the present invention. In this jitter measurement method, the detector C that is an optical sensor is mounted near one end of a scan line of parallel laser light, and scanning is performed by reflecting the parallel laser light from the laser diode LD by the micro mirror (galvano mirror) 10 that is periodically turned in a reciprocating manner. At this time, for example, the detector C outputs a detection signal SC1 when the parallel laser light is traveling toward the start point of scanning. Next, at the first scanning, the detector C outputs a detection signal SC2, and further outputs a detection signal SC3 when the parallel laser light returns to the start point of scanning. Thereafter, each time scanning is performed, detection signals SC4, SC6 . . . are outputted, and each time the light beam returns to the start point of scanning, detection signals SC5, SC7 are outputted. The detection signal SC of the detector C is outputted as shown in FIG. 18(*a*) as described above.

Figure 17:
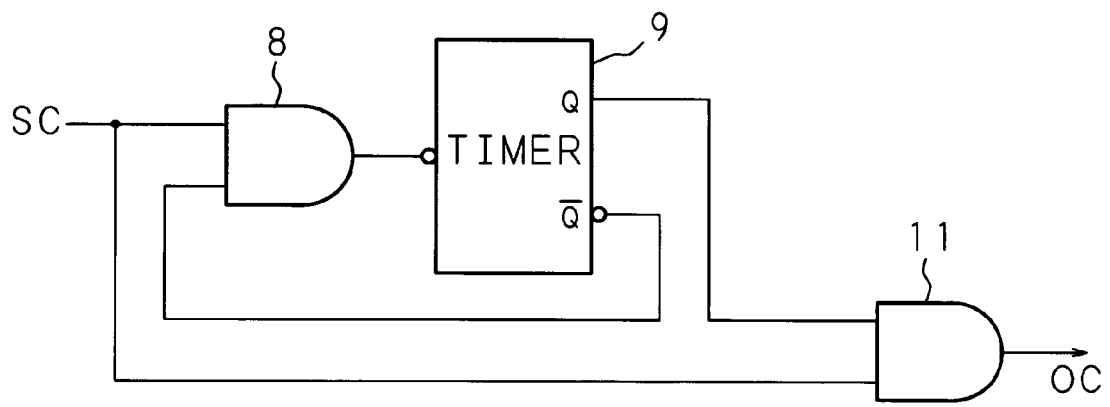
FIG. 17 is a block diagram showing a structural example of a waveform processing circuit.

FIG. 17 is a block diagram showing a structural example of the waveform processing circuit 1*b* (FIG. 15). In the waveform processing circuit 1*b*, the detection signal SC of the detector C is supplied to one input terminal of an AND gate 8 and one input terminal of an AND gate 11. An output terminal of the AND gate 8 is connected to a control terminal of a timer 9, and an output terminal Q of the timer 9 is connected the other input terminal of the AND gate 11, while an inverted output terminal bar Q of the timer 9 is connected to the other input terminal of the AND gate 8. An output terminal of the AND gate 11 outputs an output signal OC of the waveform processing circuit 1*b*. The timer 9 starts measuring time when the control signal falls, and outputs an H-level signal from the output terminal Q during a period of measuring a predetermined time. The predetermined time to be measured by the timer 9 is set longer than a time required by the parallel laser light to enter again the scan region after it went out of the scan region, and shorter than ½ of a parallel laser light scanning period.

Figure 18:
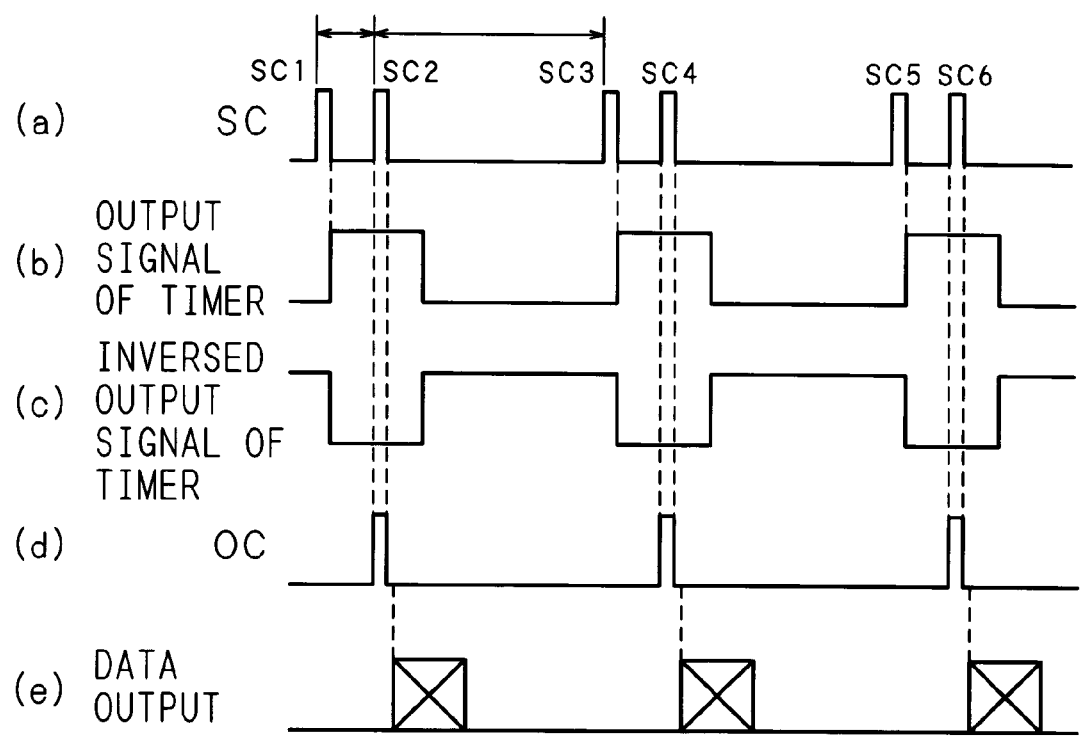
FIG. 18 is a timing chart showing the operation of the waveform processing circuit.

Referring to the timing chart shown in FIG. 18, the following description will explain the operation of the waveform processing circuit 1*b* having such a structure.

When the parallel laser light starts scanning, it moves to the start point of scanning, and if a detection signal SC1 is supplied from the detector C (a), the AND gate 8 outputs an H-level signal, and the timer 9 starts measuring the predetermined time on the fall (the fall of the detection signal SC1), and outputs an H-level signal from the output terminal Q (b) and outputs an L level signal from the inverted output terminal bar Q (c).

Next, when a detection signal SC2 is supplied from the detector C at the first scanning (a), the detection signal SC2 is outputted as a signal OC from the AND gate 11. When the measurement of the predetermined time has finished, the timer 9 makes a signal from the output terminal Q the L level (b), and makes a signal from the inverted output terminal bar Q the H level (c).

When the parallel laser light returned to the start point of scanning after finishing the first scanning and a detection signal SC3 was supplied from the detector C (a), the AND gate 8 outputs an H-level signal, and the timer 9 starts measuring the predetermined time on the fall (the fall of the detection signal SC3), and outputs an H-level signal from the output terminal Q (b) and outputs an L level signal from the inverted output terminal bar Q (c).

Next, at the second scanning, when a detection signal SC4 is supplied from the detector C (a), the detection signal SC4 is outputted as a signal OC from the AND gate 11. When the measurement of the predetermined time has finished, the timer 9 makes a signal from the output terminal Q the L level (b), and makes a signal from the inverted output terminal bar Q the H level (c).

When the parallel laser light returned to the start point of scanning after finishing the second scanning and a detection signal SC5 is supplied from the detector C (a), the AND gate 8 outputs an H-level signal, and the timer 9 starts measuring the predetermined time on the fall (the fall of the detection signal SC5), and outputs an H-level signal from the output terminal Q (b) and outputs an L level signal from the inverted output terminal bar Q (c).

Next, at the third scanning, when a detection signal SC6 is supplied from the detector C (a), the detection signal SC6 is outputted as a signal OC from the AND gate 11. When the measurement of the predetermined time has finished, the timer 9 makes a signal from the output terminal Q the L level (b), and makes a signal from the inverted output terminal bar Q the H level (c). Thereafter, similarly, the first detection signal from the detector C is extracted for each scanning, and supplied as an output signal OC (d) to the jitter measuring unit 2*b* (FIG. 15).

The jitter measuring unit 2b computes the time between the supplied output signals OC, and measures and records the variation in the calculated time as the variation (jitter) in the scan time. When the variation in the scan time exceeds a predetermined value, a signal for indicating that the variation in the scan time is large is outputted to a display device (not shown).

Note that in Embodiments 1 through 3 described above, a jitter measuring apparatus incorporated into an image forming apparatus is described. However, even when the present invention is applied to an independent jitter measuring apparatus, it has the same structures and performs the same operations.

Embodiment 4

Figure 19:
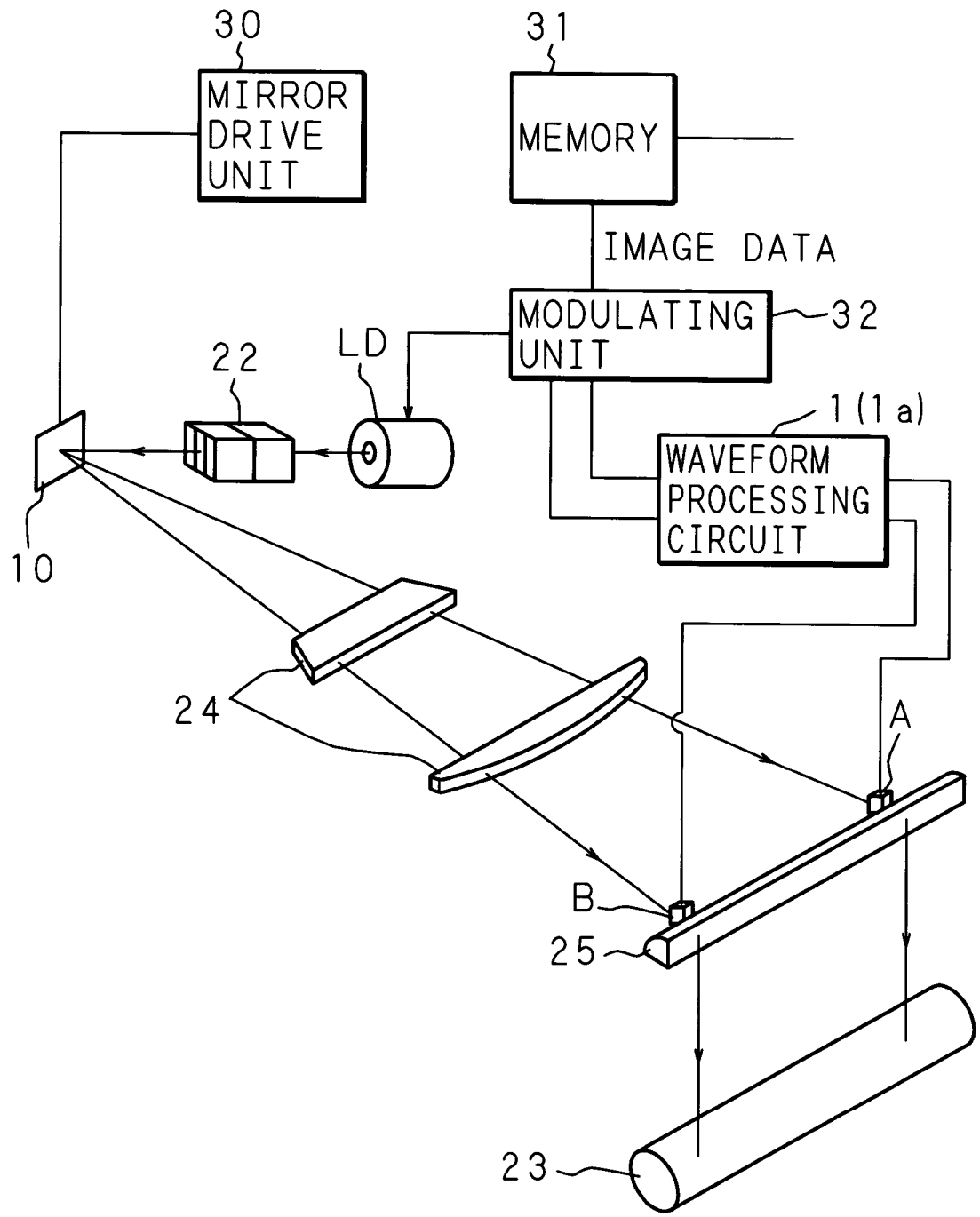
FIG. 19 is an explanatory view schematically showing the structure of a scanning optical system of a laser printer according to an embodiment of an image forming apparatus of the present invention.

FIG. 19 is an explanatory view schematically showing the structure of a scanning optical system of a laser printer according to Embodiment 4 of an image forming apparatus of the present invention. In this laser printer, a laser diode LD for emitting laser light and a collimator lens 22 for converting the laser light from the laser diode LD into parallel light are arranged on the light incident side of a micro mirror 10. On the light reflecting side of the micro mirror 10, a f-θ lens 24 for focusing the laser light onto a photoreceptor 23 and a cylindrical mirror 25 are mounted.

The parallel laser light converted by the collimator lens 22 strikes the micro mirror 10, and the micro mirror 10 is periodically turned in a reciprocating manner to scan the parallel laser light across a print width. A mirror drive unit 30 applies an AC voltage of natural frequency of the micro mirror 10 to the micro mirror 10 and reciprocally turns the micro mirror 10 in a resonant state. Image data from an external device such as a personal computer is stored in a memory 31 once, and then supplied to a modulating unit 32 according to the scan timing of the parallel laser light, and the modulating unit 32 modulates the laser light emitted by the laser diode LD in accordance with the supplied image data.

Detectors A and B are mounted at positions corresponding to the vicinity of both ends of a scan line on a light receiving surface of the cylindrical mirror 25, and respectively connected to a waveform processing circuit 1. An output signal of the waveform processing circuit 1 is supplied to the modulating unit 32. Since a structural example of the waveform processing circuit 1 is the same as the structure (FIG. 9) of the waveform processing circuit 1 explained in Embodiment 1, the explanation thereof will be omitted.

In the laser printer having such a structure, the mirror drive unit 30 reciprocally turns the micro mirror 10 in a resonant state. The parallel laser light emitted by the laser diode LD and converted by the collimator lens 22 is reflected by the micro mirror 10 that is turned reciprocally, passes through the f-θ lens 24, caused to change its direction by the cylindrical mirror 25, and scans the surface of the photoreceptor 23.

At this time, the detectors A and B detect the parallel laser light, and supplies the detection signals SA and SB to the waveform processing circuit 1. Based on the supplied detection signals SA and SB, the waveform processing circuit 1 supplies output signals OA and OB indicating the start and end of scanning to the modulating unit 32. Since the detailed operation of the waveform processing circuit 1 is the same as the operation (FIG. 10) of the waveform processing circuit 1 explained in Embodiment 1, the explanation thereof will be omitted.

The modulating unit 32 finds a timing of writing an electrostatic latent image on the surface of the photoreceptor 23 for each scanning, based on the supplied output signals OA and OB, and modulates the laser light in accordance with the image data from the memory 31, based on the found timings (start and end). The electrostatic latent image formed on the surface of the photoreceptor 23 is developed by a toner and the developed image is transferred to a sheet and then fixed (heated) in a developing unit, a transfer unit, a fixing unit, etc. (not shown) to complete printing.

Embodiment 5

The structure of a scanning optical system of a laser printer according to Embodiment 5 of an image forming apparatus of the present invention is substantially the same as the structure of the scanning optical system of the above-described laser printer according to Embodiment 4. However, the waveform processing circuit 1 is replaced by a waveform processing circuit 1a, and a structural example of the waveform processing circuit 1a is the same as the structure (FIG. 13) of the waveform processing circuit 1a explained in Embodiment 2, and therefore the explanation thereof will be omitted.

Since the laser printer having such a structure performs the same operations as the operations of the laser printer of Embodiment 4, except for the operation of the waveform processing circuit 1a that supplies the output signals OA and OB indicating the start and end of scanning to the modulating unit 32 based on the supplied detection signals SA and SB, the explanation thereof will be omitted. Moreover, since the detailed operation of the waveform processing circuit 1a is the same as the operation (FIG. 14) of the waveform processing circuit 1a explained in Embodiment 2, the explanation thereof will be omitted.

Embodiment 6

Figure 20:
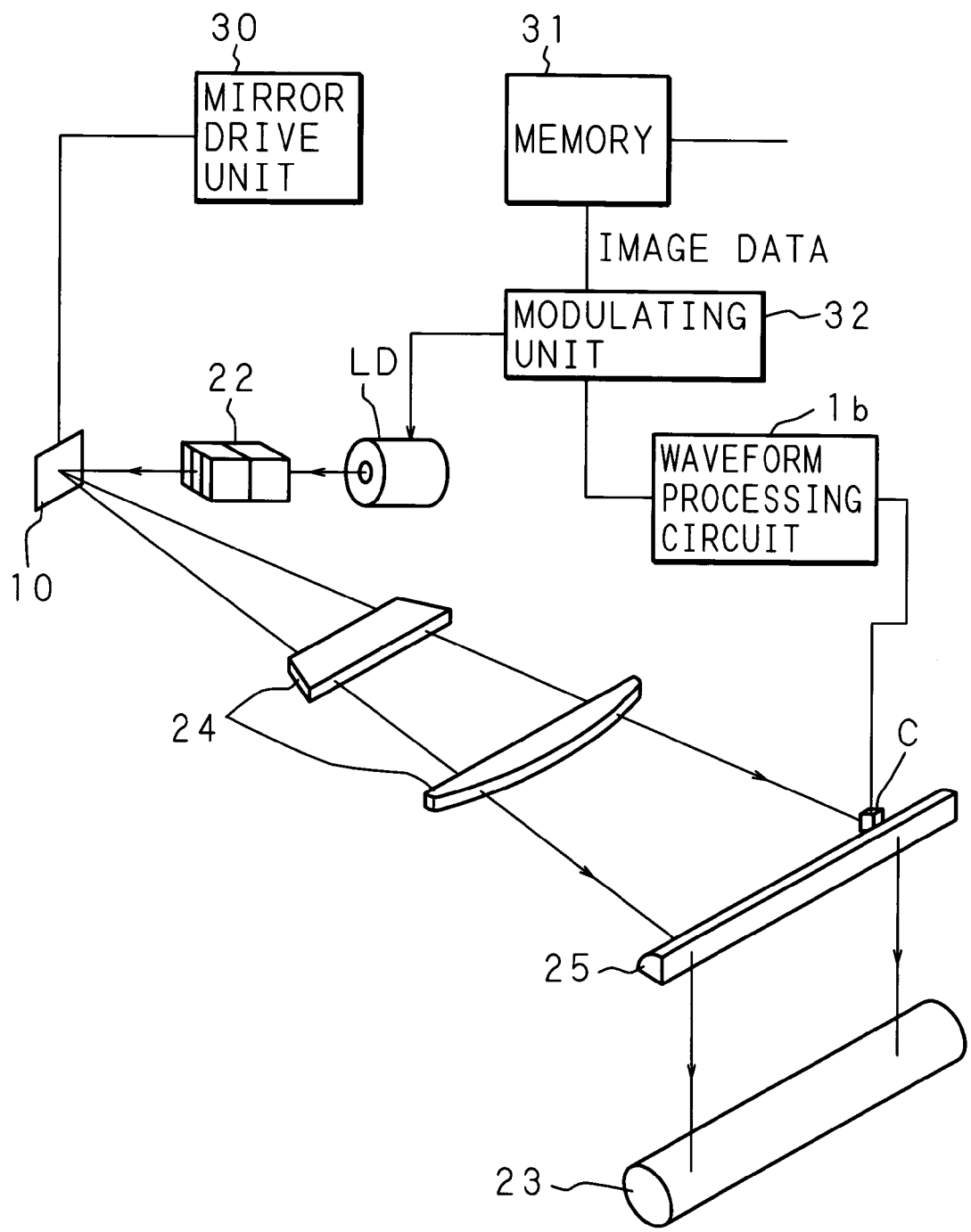
FIG. 20 is an explanatory view schematically showing the structure of a scanning optical system of a laser printer according to an embodiment of an image forming apparatus of the present invention.

FIG. 20 is an explanatory view schematically showing the structure of a scanning optical system of a laser printer according to Embodiment 6 of an image forming apparatus of the present invention. In this laser printer, a detector C is mounted at a position corresponding to the vicinity of the beginning end of a scan line on a light receiving surface of a cylindrical mirror 25, and connected to a waveform processing circuit 1b. Note that no detector is mounted at a position corresponding to the vicinity of the final end of a scan line. An output signal of the waveform processing circuit 1b is supplied to the modulating unit 32. Since other structures are the same as the structures of the scanning optical system of the laser printer of Embodiment 4 described above, the explanation thereof will be omitted. Moreover, since a structural example of the waveform processing circuit 1b is the same as the structure (FIG. 17) of the waveform processing circuit 1b explained in Embodiment 3, the explanation thereof will be omitted.

In the laser printer having such a structure, the mirror drive unit 30 reciprocally turns the micro mirror 10 in a resonant state. The parallel laser light emitted by the laser diode LD and converted by the collimator lens 22 is reflected by the micro mirror 10 that is turned reciprocally, passes through the f-θ lens 24, caused to change its direction by the cylindrical mirror 25, and scans the surface of the photoreceptor 23. At this time, the detector C detects the parallel laser light, and supplies a detection signal SC to the waveform processing circuit 1b. The waveform processing circuit 1b supplies an output signal OC indicating the start of scanning to the modulating unit 32, based on the supplied detection signal SC. Since the detailed operation of the waveform processing circuit 1b is the same as the operation (FIG. 18) of the waveform processing circuit 1*b* explained in Embodiment 3, the explanation thereof will be omitted.

The modulating unit 32 finds a timing of writing an electrostatic latent image on the surface of a photoreceptor 23 for each scanning, based on the supplied output signal OC, and modulates the laser light in accordance with the image data from the memory 31 based on the found start timing. The electrostatic latent image formed on the surface of the photoreceptor 23 is developed by a toner and the developed image is transferred to a sheet and then fixed (heated) in the developing unit, transfer unit, fixing unit, etc. (not shown) to complete printing.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A jitter measurement method for a galvano scanner for scanning a light beam on a surface to be scanned by periodically turning a reflection mirror in a reciprocating manner, comprising the steps of:
   mounting two detectors for receiving and detecting the light beam near both ends of a one-dimensional scan region of the light beam;
   extracting a first detection signal from each of the two detectors whenever the reflection mirror is activated for one scanning;
   computing a required time for one scanning from the extracted detection signals;
   measuring a variation in the required time for each scanning, based on the computed required time; and
   writing an electrostatic latent image based on the variation in the required time for each scanning.

2. A jitter measurement method for a galvano scanner for scanning a light beam on a surface to be scanned by periodically turning a reflection mirror in a reciprocating manner, comprising the steps of:
   mounting two detectors for receiving and detecting the light beam near both ends of a one-dimensional scan region of the light beam;
   inverting and retaining an output signal each time a detection signal of the detectors is outputted;
   extracting a first detection signal of the detectors since the reflection mirror was activated for one scanning, based on the inverted and retained output signals and the detection signals;
   computing a required time for one scanning from the extracted detection signals of the two detectors;
   measuring a variation in the required time for each scanning, based on the computed required time; and
   writing an electrostatic latent image based on the variation in the required time for each scanning.

3. A jitter measurement method for a galvano scanner for scanning a light beam on a surface to be scanned by periodically turning a reflection mirror in a reciprocating manner, comprising the steps of:
   mounting two detectors for receiving and detecting the light beam near a beginning end and near a final end of a one-dimensional scan region of the light beam;
   inverting and retaining an output signal each time a detection signal of the detectors is outputted;
   extracting a first detection signal of the detectors since the reflection mirror was activated for one scanning, based on the output signals inverted and retained based on the detection signal of the detector near the final end and the detection signal;
   validating the detection signals outputted by the two detectors during a time other than a time until an output signal is inverted based on the detection signal of the detector near the beginning end after extracting the detection signal;
   computing a time from the validated one detection signal to the other detection signal as a required time for one scanning;
   measuring a variation in the required time for each scanning, based on the computed required time; and
   writing an electrostatic latent image based on the variation in the required time for each scanning.

4. A jitter measurement method for a galvano scanner for scanning a light beam on a surface to be scanned by periodically turning a reflection mirror in a reciprocating manner, comprising the steps of:
   mounting a detector for receiving and detecting the light beam near one end of a one-dimensional scan region of the light beam;
   extracting a first detection signal of the detector whenever the reflection mirror is activated for one scanning;
   computing a time between two detection signals extracted one after another;
   measuring a variation in the computed time as a variation in a required time for each scanning; and
   writing an electrostatic latent image based on the variation in the required time for each scanning.

5. A jitter measuring apparatus for a galvano scanner for scanning a light beam on a surface to be scanned by periodically turning a reflection mirror in a reciprocating manner, comprising:
   two detectors, mounted near both ends of a one-dimensional scan region of the light beam, for receiving and detecting the light beam;
   two extracting units for extracting a first detection signal of each of the two detectors whenever the reflection mirror is activated for one scanning;
   a computing unit for computing a required time for one scanning from the detection signals extracted by the two extracting units; and
   a measuring unit for measuring a variation in the required time for each scanning, based on the required time computed by the computing unit.

6. A jitter measuring apparatus for a galvano scanner for scanning a light beam on a surface to be scanned by periodically turning a reflection mirror in a reciprocating manner, comprising:
   two detectors, mounted near both ends of a one-dimensional scan region of the light beam, for receiving and detecting the light beam;
   two inverting and retaining units for inverting and retaining an output signal each time a detection signal of the detectors is outputted;
   two extracting units for extracting a first detection signal of each of the detectors since the reflection mirror was activated for one scanning, based on the output signals of the inverting and retaining units and the detection signals;
   a computing unit for computing a required time for one scanning from the detection signals extracted by the two extracting units; and
   a measuring unit for measuring a variation in the required time for each scanning, based on the required time computed by the computing unit.

7. A jitter measuring apparatus for a galvano scanner for scanning a light beam on a surface to be scanned by periodically turning a reflection minor in a reciprocating manner, comprising:
- two detectors, mounted near a beginning end and near a final end of a one-dimensional scan region of the light beam, for receiving and detecting the light beam;
- two inverting and retaining units for inverting and retaining an output signal each time a detection signal of the detectors is outputted;
- an extracting unit for extracting a first detection signal of the detectors since the reflection mirror was activated for one scanning, based on the output signals of the inverting and retaining units based on the detection signal of the detector near the final end and the detection signal;
- a validating unit for validating the detection signals outputted by the two detectors during a time other than a time until an output signal of the inverting and retaining units is inverted based on the detection signal of the detector near the beginning end after the extracting unit extracted the detection signal;
- a computing unit for computing a time between the two detection signals validated by the validating unit as a required time for one scanning; and
- a measuring unit for measuring a variation in the required time for each scanning, based on the computed required time.

8. A jitter measuring apparatus for a galvano scanner for scanning a light beam on a surface to be scanned by periodically turning a reflection mirror in a reciprocating manner, comprising:
- a detector, mounted near one end of a one-dimensional scan region of the light beam, for receiving and detecting the light beam;
- an extracting unit for extracting a first detection signal of the detector since the reflection mirror was activated for one scanning;
- a computing unit for computing a time between two detection signals extracted one after another by the extracting unit; and
- a measuring unit for measuring a variation in the time computed by the computing unit as a variation in a required time for each scanning.

9. An image forming apparatus including a galvano scanner for scanning a light beam on a photoreceptor surface by periodically turning a reflection mirror in a reciprocating manner, comprising:
- two detectors, mounted near both ends of a one-dimensional scan region of the light beam, for receiving and detecting the light beam;
- two extracting units for extracting a first detection signal of each of the two detectors whenever the reflection mirror is activated for one scanning; and
- a writing unit for writing an electrostatic latent image on the photoreceptor surface, based on timings of the detection signals extracted by the two extracting units.

10. An image forming apparatus including a galvano scanner for scanning a light beam on a photoreceptor surface by periodically turning a reflection mirror in a reciprocating manner, comprising:
- two detectors, mounted near both ends of a one-dimensional scan region of the light beam, for receiving and detecting the light beam;
- two inverting and retaining units for inverting and retaining an output signal each time a detection signal of the detectors is outputted;
- two extracting units for extracting a first detection signal of each of the detectors since the reflection mirror was activated for one scanning, based on the output signals of the inverting and retaining units and the detection signals; and
- a writing unit for writing an electrostatic latent image on the photoreceptor surface, based on timings of the detection signals extracted by the two extracting units.

11. An image forming apparatus including a galvano scanner for scanning a light beam on a photoreceptor surface by periodically turning a reflection mirror in a reciprocating manner, comprising:
- two detectors, mounted near a beginning end and near a final end of a one-dimensional scan region of the light beam, for receiving and detecting the light beam;
- two inverting and retaining units for inverting and retaining an output signal each time a detection signal of the detectors is outputted;
- an extracting unit for extracting a first detection signal of the detectors since the reflection mirror was activated for one scanning, based on the output signals of the inverting and retaining unit based on the detection signal of the detector near the final end and the detection signal;
- a validating unit for validating the detection signals outputted by the two detectors during a time other than a time until an output signal of the inverting and retaining unit is inverted based on the detection signal of the detector near the beginning end after the extracting unit extracted the detection signal; and
- a writing unit for writing an electrostatic latent image on the photoreceptor surface, based on timings of the two detection signals validated by the validating unit.

12. An image forming apparatus including a galvano scanner for scanning a light beam on a photoreceptor surface by periodically turning a reflection mirror in a reciprocating manner, comprising:
- a detector, mounted near one end of a one-dimensional scan region of the light beam, for receiving and detecting the light beam;
- an extracting unit for extracting a first detection signal of the detector since the reflection mirror was activated for one scanning; and
- a writing unit for writing an electrostatic latent image on the photoreceptor surface, based on a timing of tile detection signal extracted by the extracting unit.

* * * * *